(12) United States Patent
M'Saad et al.

(10) Patent No.: US 6,413,871 B2
(45) Date of Patent: *Jul. 2, 2002

(54) NITROGEN TREATMENT OF POLISHED HALOGEN-DOPED SILICON GLASS

(75) Inventors: Hichem M'Saad, Santa Clara; Derek R. Witty, Fremont; Manoj Vellaikal, Santa Clara; Lin Zhang, San Jose; Yaxin Wang, Fremont, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,983

(22) Filed: Jun. 22, 1999

(51) Int. Cl.[7] .................... H01L 21/3105; H01L 21/469
(52) U.S. Cl. ................. 438/692; 117/569; 117/574; 117/579; 438/690; 438/691; 438/694; 438/759; 438/761; 438/762; 438/763; 438/784
(58) Field of Search .................. 427/569, 574, 427/579; 438/759, 761, 763, 762, 784, 690, 691, 692, 694

(56) References Cited

U.S. PATENT DOCUMENTS

| 5,738,574 A | | 4/1998 | Tolles et al. ................ 451/288 |
| 5,869,149 A | * | 2/1999 | Denison et al. ............. 427/579 |
| 5,908,672 A | | 6/1999 | Ryu et al. .................... 427/574 |
| 6,008,120 A | * | 12/1999 | Lee et al. .................... 438/634 |
| 6,103,601 A | * | 8/2000 | Lee et al. .................... 438/513 |

OTHER PUBLICATIONS

S. Takeishi et al., "Stabilizing Dielectric Constants of Fluorine–Doped–$SiO_2$ Films by $N_2$–Plasma Annealing," *DUMIC Conference*—Feb. 21–22, 1995, pp. 257–259 (Feb. 1995).

* cited by examiner

Primary Examiner—James Derrington
(74) Attorney, Agent, or Firm—Townsend and Townsend and Crew

(57) ABSTRACT

A film of fluorine-doped silicon glass ("FSG") is exposed to a nitrogen-containing plasma to nitride a portion of the FSG film. In one embodiment, the FSG film is chemically-mechanically polished prior to nitriding. The nitriding process is believed to scavenge moisture and free fluorine from the FSG film. The plasma can heat the FSG film to about 400° C. for about one minute to incorporate about 0.4 atomic percent nitrogen to a depth of nearly a micron. Thus, the nitriding process can passivate the FSG film deeper than a via depth.

18 Claims, 13 Drawing Sheets

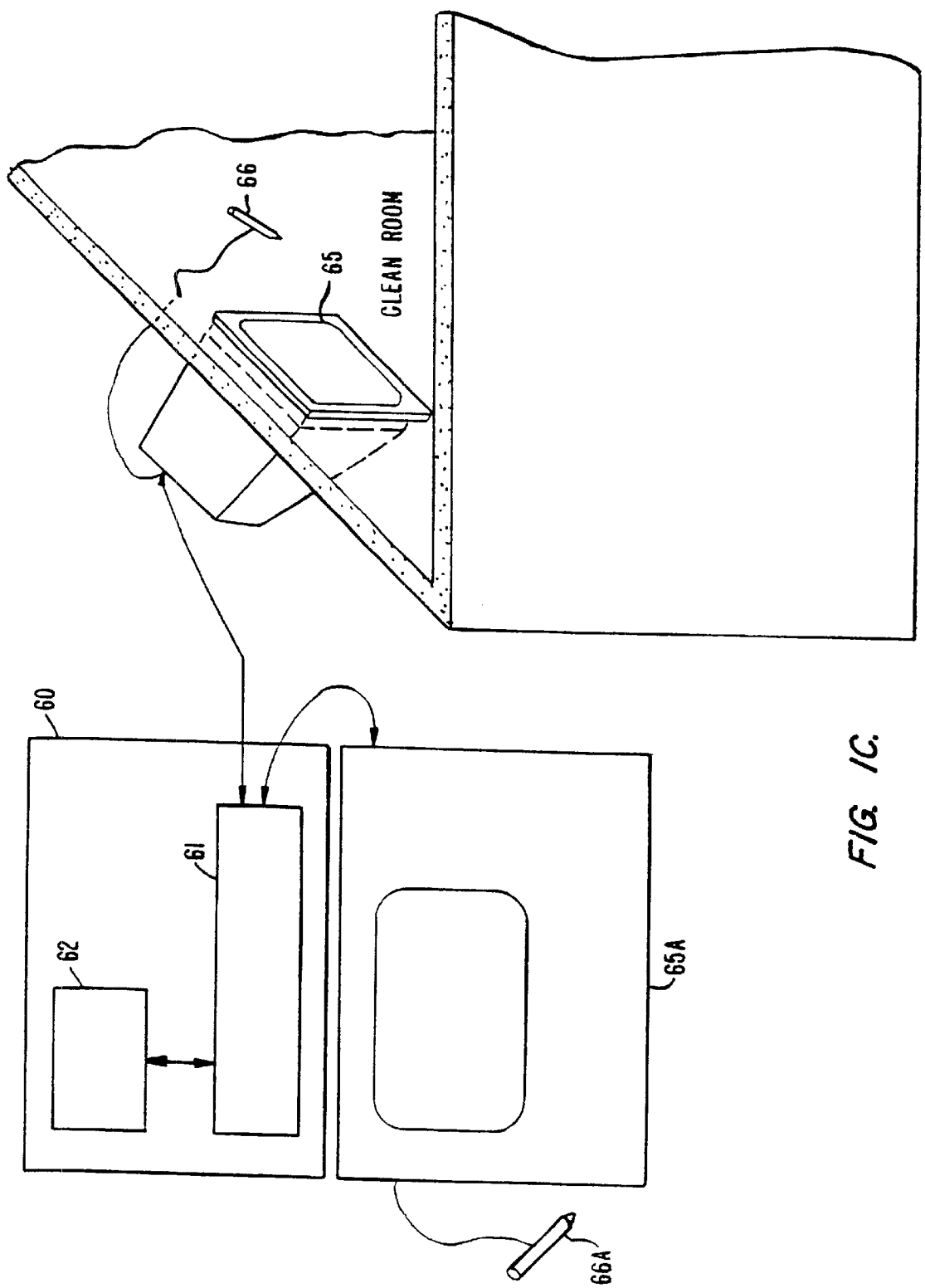
FIG. IC.

US 6,413,871 B2

NITROGEN TREATMENT OF POLISHED HALOGEN-DOPED SILICON GLASS

BACKGROUND OF THE INVENTION

The present invention relates to the fabrication of integrated circuits. More particularly, the invention provides a method and apparatus for fabricating devices with improved dielectric layers.

Integrated circuits continue to evolve, typically becoming more complex. This increasing complexity arises from the desire to include more capability, i.e., higher levels of integration, on the semiconductor chips from which and on which integrated circuits are fabricated. For example, great effort has gone into making the circuit components (transistors, capacitors, etc.) of integrated devices smaller, bringing the components closer together and allowing more components per unit of chip area.

As device feature sizes in integrated circuits get smaller, new concerns arise about the performance of the integrated circuit. These matters may need to be addressed differently in new generation devices. For example, operating speed and power consumption can be affected by the integrated circuit's sensitivity to the dielectric constant of the material used to electrically insulate conductive structures such as metal traces. Various forms of silicon oxide or silicon-oxide-based glass are often used as insulating material in the fabrication of integrated circuits. Silicon oxide has an acceptably low dielectric constant for some applications, but an even lower dielectric constant is desirable for many types of circuits.

Adding fluorine to silicon oxide to produce what is called fluorine-doped silicon glass ("FSG") can lower the dielectric constant of the insulating material. However, adding fluorine to the silicon oxide, typically done during a chemical-vapor deposition ("CVD") process, such as a plasma-enhanced CVD ("PECVD") process, raises new issues with the manufacturing process. For example, "free" (unbound) fluorine can combine with water, including atmospheric water vapor, to form hydrofluoric acid. This hydrofluoric acid may then corrode or otherwise chemically attack some of the materials used in the manufacture of integrated circuits, such as aluminum metal traces. Furthermore, water absorbed by an FSG film typically increases the dielectric constant of the film, which the fluorine was intended to lower in the first place.

Various techniques have been developed to address the problems that free fluorine and hydrofluoric acid can create. One technique has been to form a "cap" of undoped silicon glass ("USG") over the FSG to seal the FSG from the ambient atmosphere until the integrated circuit can be further processed, overlying the FSG-USG layer with another film. Other techniques, such as surface heating or baking the wafer, have been developed to stabilize FSG films.

The application of new integrated circuit manufacturing methods limits the utility of conventional FSG stabilization techniques in some fabrication processes, however. For example, chemical-mechanical polishing ("CMP") techniques are currently incorporated in manufacturing processes of various integrated circuit manufacturers. CMP generally removes a selected amount of material from an integrated circuit wafer and planarizes the surface of the wafer. For example, if a layer of insulating material is deposited over a patterned layer of conductive material, such as traces, at least a portion of the topology of the patterned layer often persists on the surface of the deposited layer. A wide variety of planarizing techniques have been developed. Because of the flat, smooth surface produced by CMP processing, however, it is the most appropriate planarizing technique for some applications. CMP generally uses a polishing pad and specialized polishing compound to remove the high spots on the surface of the wafer and to polish the surface to a flat plane. The flat surface provided by CMP is desirable when, among other reasons, a subsequent layer will be deposited and patterned, especially if very small features will be defined in the subsequent layer. However, because CMP typically removes the top portion of the surface of the layer, the process can interfere with the stabilization techniques used on FSG films when the FSG film is polished.

Therefore, an FSG stabilization technique that is compatible with CMP processing is desirable. It is further desirable that any such FSG stabilization technique be compatible with standard integrated circuit materials and performable in an integrated circuit fabrication environment.

SUMMARY OF THE INVENTION

The invention provides a process and apparatus for fabricating an integrated circuit device on a substrate (e.g., a silicon wafer) that allows for FSG layers to be planarized with a CMP processing step and still maintain their stability during subsequent processing steps.

In one embodiment, an FSG film is deposited on the substrate and then chemically-mechanically polished. The polished surface is subsequently nitrided by exposing the polished surface of the FSG film to nitrogen. For example, the substrate is heated to facilitate diffusion of nitrogen into the FSG film while the substrate is exposed to plasma formed primarily from nitrogen gas ($N_2$). In a further embodiment, the substrate is heated using plasma that includes a bias RF component to reduce the source plasma power necessary to attain the desirable surface temperature, thus reducing particulate contamination of the surface of the substrate. It is preferable in such a nitriding process to incorporate nitrogen into the FSG film to a depth of at least 5000 Å, or to at least the via depth, as described below.

For a further understanding of the objects and advantages of the present invention, reference should be made to the ensuing detailed description taken in conjunction with the accompanying drawings.

BRIEF DESCRIPTION OF THE DRAWINGS

FIG. 1C is a simplified diagram of a monitor and light pen that may be used in conjunction with the exemplary CVD processing chamber of FIG. 1A;

DESCRIPTION OF THE SPECIFIC EMBODIMENTS

I. Introduction

The present invention stabilizes a polished FSG film by nitriding the surface of the FSG film after a CMP process step. The CMP process is typically a wet process, which can hydrate the FSG film. Exposing the surface of the chemically-mechanically polished FSG film to a nitrogen plasma under selected conditions incorporates nitrogen into the FSG film. It is believed that the nitrogen in the FSG film acts as a scavenging/gettering agent for both hydrogen and free fluorine, thus suppressing the formation of hydrofluoric acid.

Additionally, the nitrogen stabilizes the FSG film, reducing the potential for subsequent absorption of moisture from the environment; however, this aspect is less critical in an embodiment where a subsequent layer is deposited on the polished, nitrided FSG surface without breaking vacuum after the nitrogen plasma treatment. In a particular embodiment, bias plasma RF power is used in combination with source plasma RF power to heat the surface of a substrate coated with a chemically-mechanically polished FSG film to a temperature of about 400° C. Under these conditions, the FSG film is nitrided in a reasonable time period to approximately the "via depth." (The distance between the chemically-mechanically polished surface of the FSG layer and a conductive layer beneath the surface of the FSG layer determines the depth at which a via will subsequently be opened and filled to make an electrical connection with the conductive layer. This is the "via depth.") Adding nitrogen to at least the via depth of the FSG film suppresses the formation of HF in the via region. Such HF formation might otherwise lead to corrosion, delamination, or adhesion problems with the via-filling material or other structures.

II. Exemplary Substrate Processing System

Figure 1A:
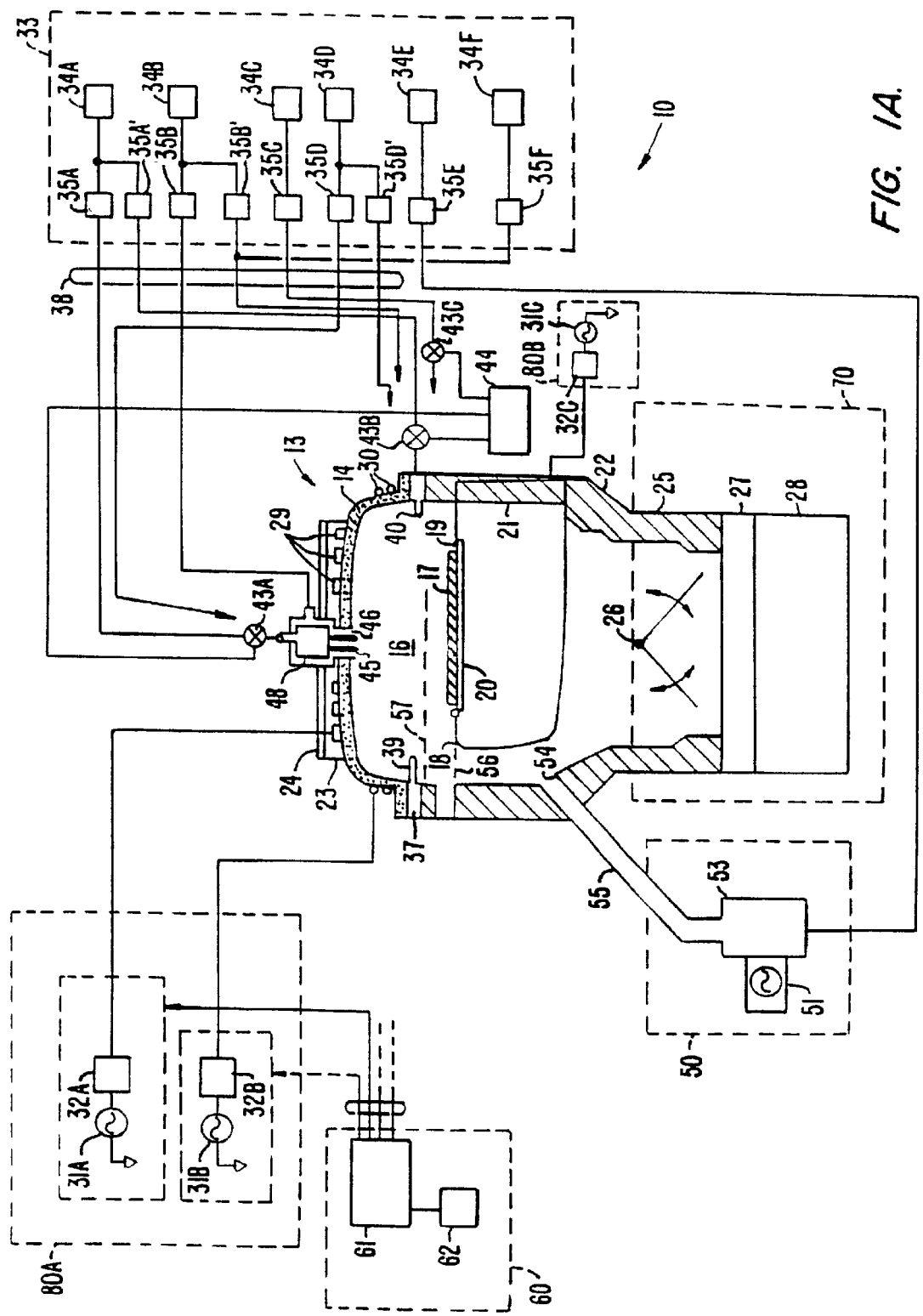
FIG. 1A is a simplified diagram of an exemplary high density chemical vapor deposition system that can be used to practice the method of the present invention.

FIG. 1A illustrates one embodiment of a high density plasma chemical vapor deposition (HDP-CVD) system 10 in which a halogen-doped dielectric layer according to the present invention can be deposited and then subsequently subject to a nitride treatment step after being chemically-mechanically polished. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that can selectively secure the substrate to substrate support member 18 during substrate processing, if desired. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 mTorr to about 2 Torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
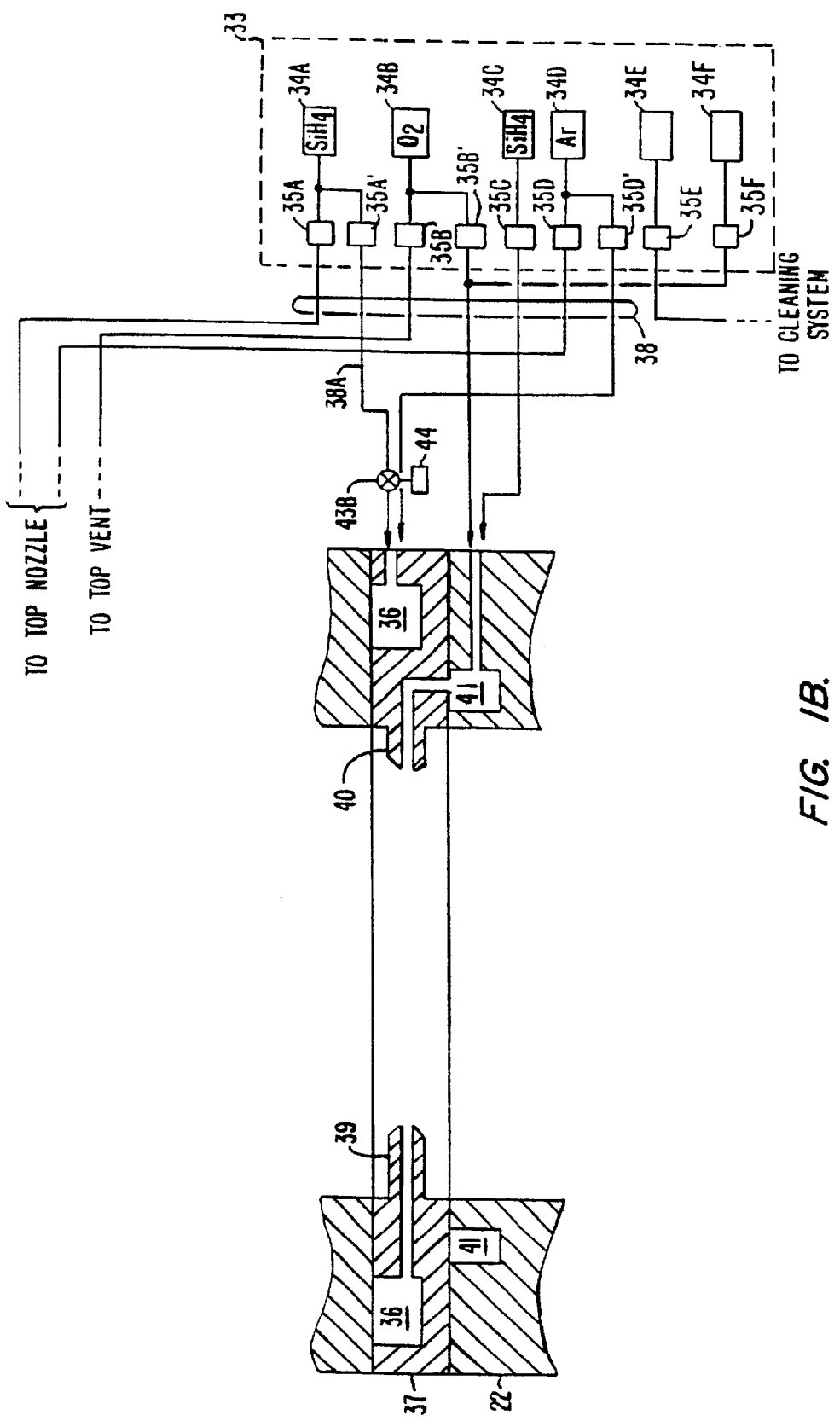
FIG. 1B is a simplified cross section of a gas ring that may be used in conjunction with the exemplary CVD processing chamber of FIG. 1A.

A gas delivery system 33 provides gases from several sources, 34A–34F, to the chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

An In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) to the oxidizer nozzles of the gas ring to the chamber for process steps utilizing nitrogen plasma. Alternatively, the nitrogen gas could be delivered to the chamber through other or additional inlets, such as the top nozzle. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 1C.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
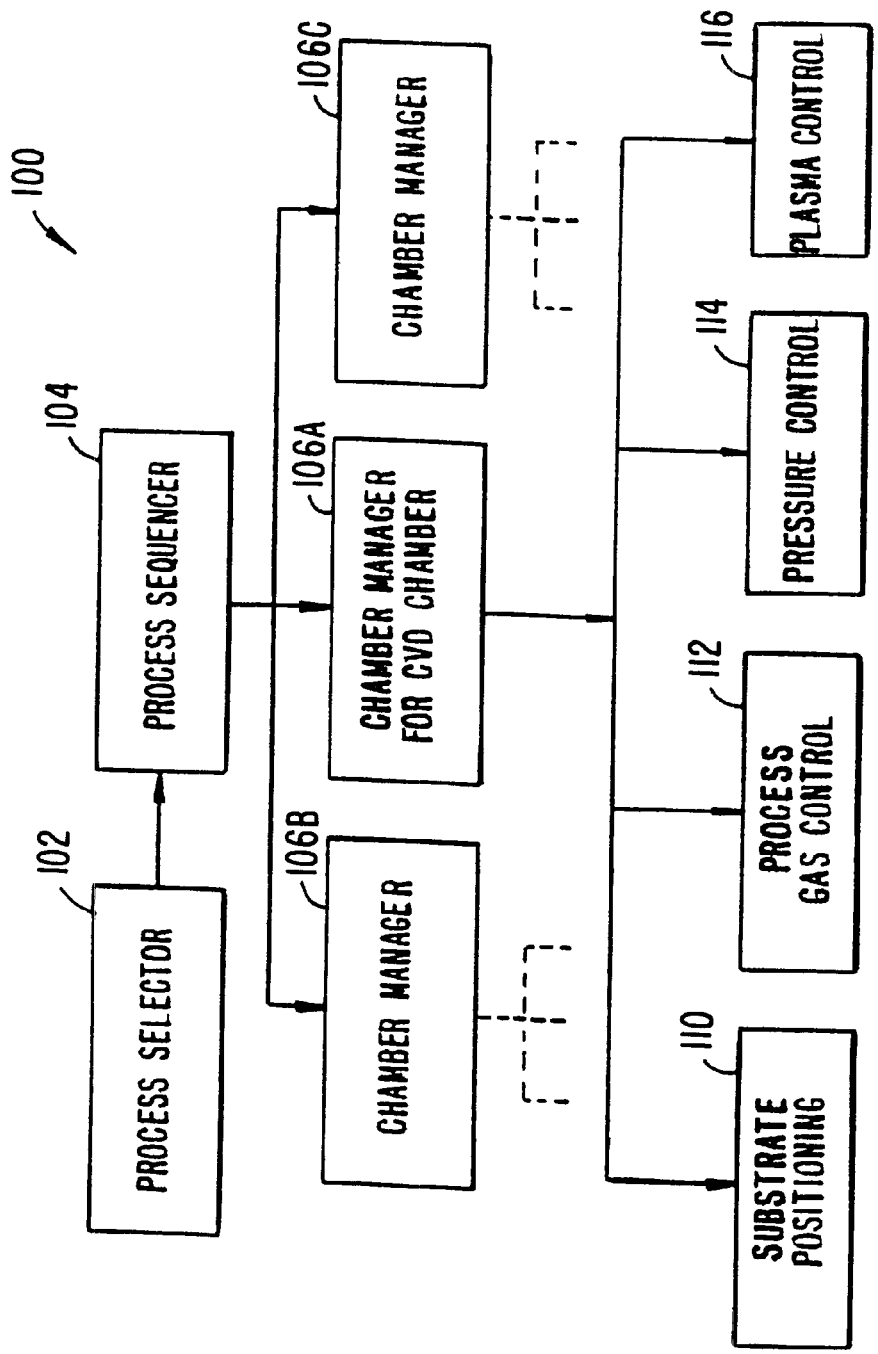
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 102 in response to menus or screens displayed on the CRT monitor by using the light pen interface. The process sets are predetermined sets of process parameters necessary to carry out specified processes, and are identified by predefined set numbers. Process selector subroutine 102 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 104 comprises program code for accepting the identified process chamber and set of process parameters from the process selector subroutine 102 and for controlling operation of the various process chambers. Multiple users can enter process set numbers and process chamber numbers, or a single user can enter multiple process set numbers and process chamber numbers; sequencer subroutine 104 schedules the selected processes in the desired sequence. Preferably, sequencer subroutine 104 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 104 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 104 determines which process chamber and process set combination is going to be executed next, sequencer subroutine 104 initiates execution of the process set by passing the particular process set parameters to a chamber manager subroutine 106A–C, which controls multiple processing tasks in chamber 13 and possibly other chambers (not shown) according to the process set sent by sequencer subroutine 104.

Examples of chamber component subroutines are substrate positioning subroutine 110, process gas control subroutine 112, pressure control subroutine 114, and plasma control subroutine 116. Those having ordinary skill in the art will recognize that other chamber control subroutines can be included depending on what processes are selected to be performed in chamber 13. In operation, chamber manager subroutine 106A selectively schedules or calls the process component subroutines in accordance with the particular process set being executed. Chamber manager subroutine 106A schedules process component subroutines in the same manner that sequencer subroutine 104 schedules the process chamber and process set to be executed. Typically, chamber manager subroutine 106A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 110 comprises program code for controlling chamber components that are used to load a substrate onto substrate support number 18. Substrate positioning subroutine 140 may also control transfer of a substrate into chamber 13 from, e.g., a CMP chamber or other chamber in the multi-chamber system, after other processing has been completed.

Process gas control subroutine 112 has program code for controlling process gas composition and flow rates. Subroutine 112 controls the open/close position of the safety shut-off valves and also ramps up/ramps down the mass flow controllers to obtain the desired gas flow rates. All chamber component subroutines, including process gas control subroutine 112, are invoked by chamber manager subroutine 106A. Subroutine 112 receives process parameters from chamber manager subroutine 106A related to the desired gas flow rates.

Typically, process gas control subroutine 112 opens the gas supply lines, and repeatedly (i) reads the necessary mass flow controllers, (ii) compares the readings to the desired flow rates received from chamber manager subroutine 106A, and (iii) adjusts the flow rates of the gas supply lines as necessary. Furthermore, process gas control subroutine 112 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 112 is programmed to include steps for flowing the inert gas into chamber 13 for an amount of time necessary to stabilize the pressure in the chamber. The steps described above may then be carried out.

The process gas control subroutine 112 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 114 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 114, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 114 is invoked, the desired, or target, pressure level is received as a parameter from chamber manager subroutine 106A. Pressure control subroutine 114 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 114 may open or close throttle valve 26 to a particular opening size to regulate the pressure in chamber 13 to a desired pressure or pressure range.

Plasma control subroutine 116 comprises program code for controlling the frequency and power output setting of RF generators 31A and 31B and for tuning matching networks 32A and 32B. Plasma control subroutine 116, like the previously described chamber component subroutines, is invoked by chamber manager subroutine 106A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purposes only. It would be a matter of routine skill for a person of skill in the art to select an appropriate conventional substrate processing system and computer control system to implement the method of present invention.

Figure 1E:
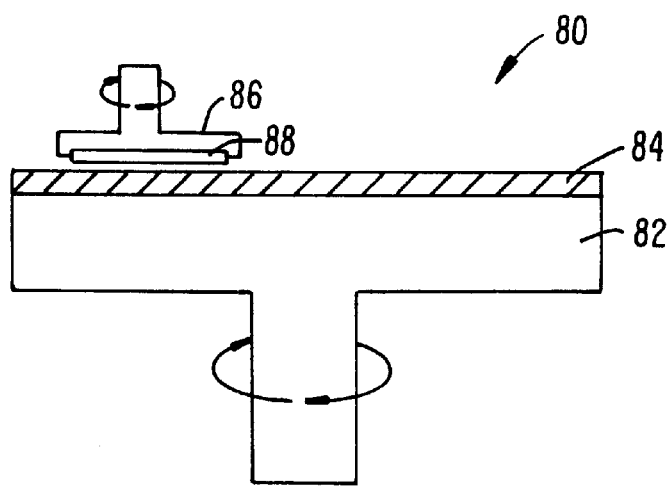
FIG. 1E is a simplified drawing of an exemplary chemical mechanical polishing chamber that can be used to planarize a halogen-doped layer in certain embodiments of the present invention.

FIG. 1E is a simplified, cross-sectional view of an exemplary CMP chamber 80 in which a halogen-doped silicon oxide layer can be polished and planarized in certain embodiments of the present invention. CMP chamber 80 includes a rotating table 82 having a polishing pad 84 disposed on its upper surface. A rotating substrate holder 86 holds a substrate 88, such as a semiconductor wafer, while the substrate is polished by pad 84. During polishing an appropriate slurry is applied between substrate 88 and pad 84 and a predetermined pressure is exerted on the substrate by the pad.

Figure 1F:
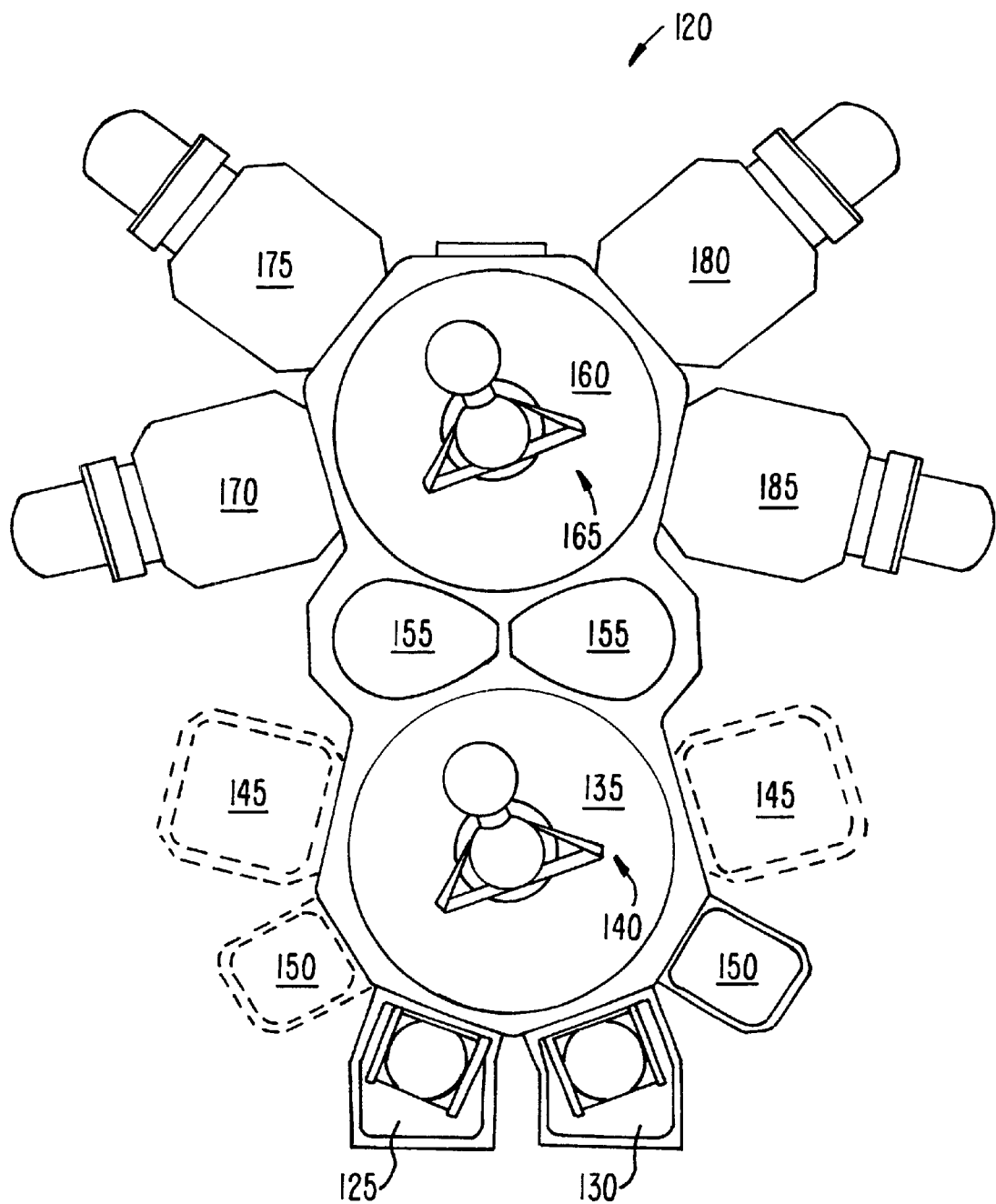
FIG. 1F is a simplified diagram of an exemplary cluster tool substrate processing system that may be used to practice the method of the present invention.

Chambers 13 and 80 may be part of a cluster tool system in which multiple substrate processing chambers are situated around and served by a central robot. An example of such a cluster tool system 120 is shown in FIG. 1F. Alternatively, chamber 13 may be part of cluster tool system 120 and CMP chamber 80 may be part of a separate CMP tool that has multiple polishing stations or chambers. Substrates may be manually transferred between system 120 and the separate CMP tool or may be automatically transferred using conveyor belts and/or an appropriate robot system as would be known to those of skill in the art. An example of such a multiple station CMP apparatus and related techniques is provided in U.S. Pat. No. 5,738,574, entitled CONTINUOUS PROCESSING SYSTEM FOR CHEMICAL MECHANICAL POLISHING, by Tolles et al., commonly assigned to Applied Materials, Inc., and is hereby incorporated by reference for all purposes. One commercially available, multiple station CMP device that is a separate cluster tool that can be used to planarize a halogen-doped layer for the present invention is the mirra™ CMP system manufactured by Applied Materials, Inc.

In FIG. 1F, a cluster tool system 120 includes vacuum load-lock chambers 125 and 130. Load-lock chambers 125 and 130 maintain vacuum conditions within inner chamber 135 while substrates enter and exit system 120. A robot 140 serves substrates from/to load-lock chambers 125 and 130 to substrate processing chambers 145 and heating chambers 150. Processing chambers 145 can be outfitted to perform a number of substrate processing operations such as CVD, etch or the like. Heating chambers 150 can be used in heat treatment steps such as anneal steps.

Pass-through chambers 155 are used to maintain ultra high vacuum conditions in inner chambers 160 while allowing substrates to be transferred from robot 135 to a robot 165. Robot 165 serves substrates from pass-through chambers 155 to substrate processing chambers 170 to 185. Similar to processing chambers 145, processing chambers 170 to 185 can be outfitted to perform a variety of substrate processing operations. In one instance, processing chamber 170 is outfitted to perform a CMP operation and processing chamber 175 is outfitted to perform a nitriding process according to the present invention and processing chamber 180 performs an FSG deposition.

During operation, substrates are brought to vacuum load-lock chambers 125 and 130 by a conveyor belt or robot system (not shown) that operates under the control of computer program executed by system controller 60. Also, robots 140 and 165 operate under control of the computer program executing on system controller 60 to transfer substrates between the various processing chambers of cluster tool 120.

III. Exemplary Process Flow

Figure 2:
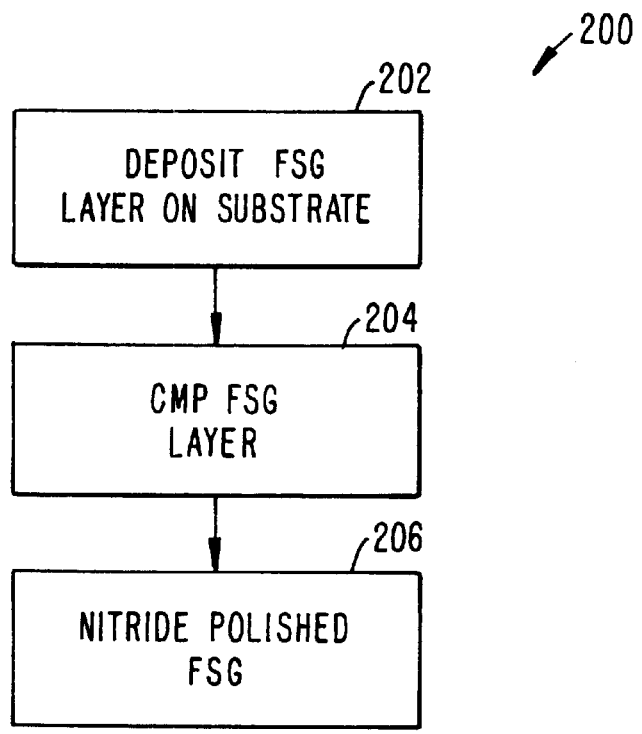
FIG. 2 is a simplified flow chart representing a process for fabricating an integrated circuit device according to one embodiment of the present invention.

FIG. 2 is a simplified flow chart representing an example of a process 200 according to the present invention. In FIG. 2, an FSG layer is deposited on a substrate (step 202). The FSG layer is then chemically-mechanically polished to planarize the film (step 204), and afterwards, the surface of the FSG layer is nitrided (step 206) as described later in this application. Those skilled in the art will appreciate that additional process steps, such as post-CMP cleaning, may be performed. The substrate may then be further processed (not shown) to complete the fabrication of integrated circuits on the substrate.

In one particular exemplary application of the present invention, the deposited FSG layer has a fluorine concentration of about 7 atomic percent (at. %) and an as-deposited thickness of about 16,000 Å. An example of an FSG deposition sequence can be found in U.S. patent application Ser. No. 08/868,286, filed Jun. 3, 1997, and entitled "SEQUENCING THE RECIPE STEPS FOR THE OPTIMAL LOW-DIELECTRIC CONSTANT HDP-CVD PROCESSING" issued to Orczyk et al. The Ser. No. 08/868,286 application is assigned to Applied Materials, Inc., the assignee of the present application and is hereby incorporated by reference for all purposes. The deposition sequence described in U.S. patent application Ser. No. 08/868,286 describes a sequence that includes depositing a USG liner layer before depositing the FSG layer. Prior to depositing any film, the wafer is heated by a plasma without RF bias being applied to the plasma (i.e., using source RF power only). This heating sequence avoids sputter etching the fine patterns, such as the corners of metal traces, over which the dielectric layer is subsequently deposited. Later in the sequence, conditions are maintained to avoid sputter etching or fluorine etching of the fine features, including the thin liner layer covering the corners of the metal traces. Those skilled in the art understand that other processes can be used to deposit the FSG layer. For example, it is possible to heat the wafer using both RF source power and bias power prior to depositing the initial material. Also, some applications may include a USG liner layer. This method heats the wafer more quickly than using only source RF power, thus improving throughput, and is preferred in some instances.

In this exemplary application, the FSG layer is chemically-mechanically polished to a thickness of approximately 9,000–10,000 Å using a Mirra™ CMP system manufactured by Applied Materials, Inc. Those skilled in the art will understand that the thicknesses and doping concentrations are provided by way of example only and that other thicknesses or other doping concentrations of an FSG film may be used. Examples of processes and further details for nitriding the surface of the FSG layer are given below in Section V.

IV. Exemplary Device Structure

Figure 3A:
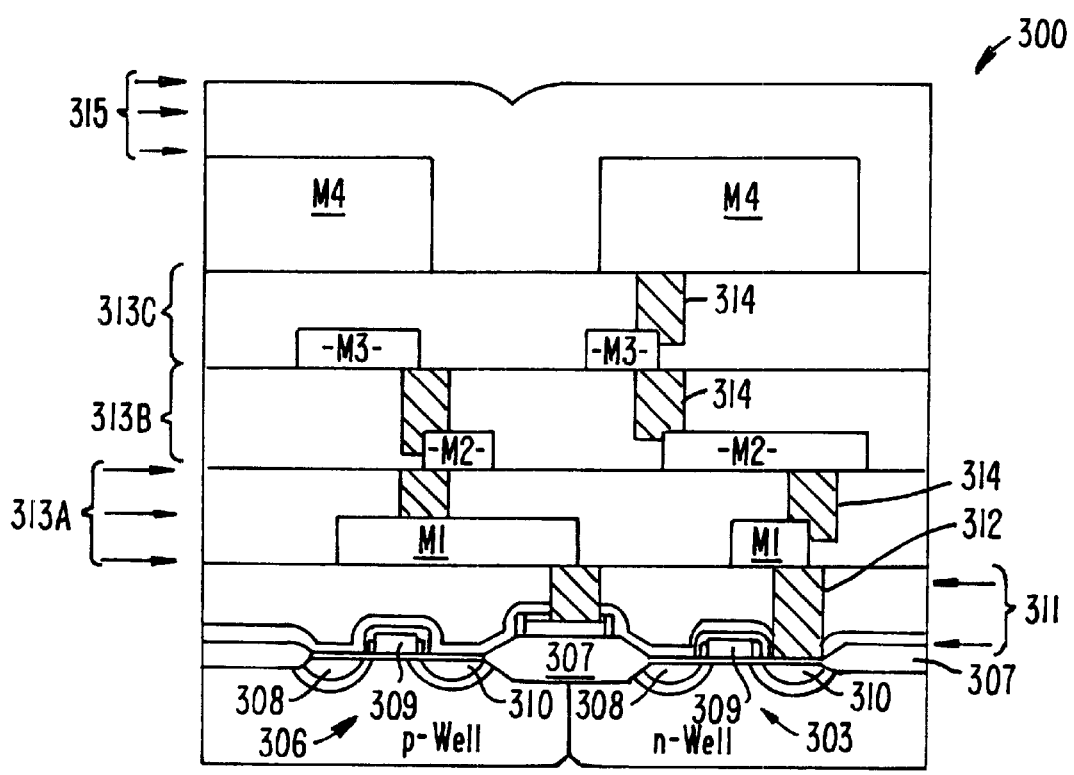
FIG. 3A is a simplified cross sectional view of part of an integrated circuit produced according to one embodiment of the present invention.

FIG. 3A illustrates a simplified cross-sectional view of an integrated circuit 300 incorporating features of the present invention. Integrated circuit 300 may be fabricated on a semiconductor wafer, such as a silicon wafer, gallium-arsenide wafer, or other wafer. As shown in FIG. 3A, integrated circuit 300 includes NMOS and PMOS transistors 303 and 306, which are separated and electrically isolated from each other by a field oxide region 307. Each transistor 303 and 306 comprises a source region 308, a gate region 309, and a drain region 310.

A premetal dielectric layer 311 separates transistors 303 and 306 from metal layer M1, with connections between metal layer M1 and the transistors made by contacts 312. Metal layer M1 is one of four metal layers, M1–M4, included in integrated circuit 300. Each metal layer M1–M4 is separated from adjacent metal layers by respective inter-metal dielectric (IMD) layers 313A–C. Adjacent metal layers are connected at selected openings by vias 314. Planar passivation layer 315 overlies metal layer M4.

Embodiments of the present invention are particularly useful for IMD layers, but may find uses in each of the dielectric layers shown in integrated circuit 300. It should be understood that the simplified integrated circuit 300 is for illustrative purposes only. One of ordinary skill in the art could implement the present method for fabrication of other integrated circuits, such as microprocessors, application-specific integrated circuits, memory devices, and the like. The method of the present invention may be used in the fabrication of integrated circuits using other technologies, such as BiCMOS, NMOS, bipolar, and others. Additionally, the method of the present invention may be used with damascene and dual damascene process techniques that are commonly used to fabricate devices having feature sizes of 0.25 µm and less.

Figure 3B:
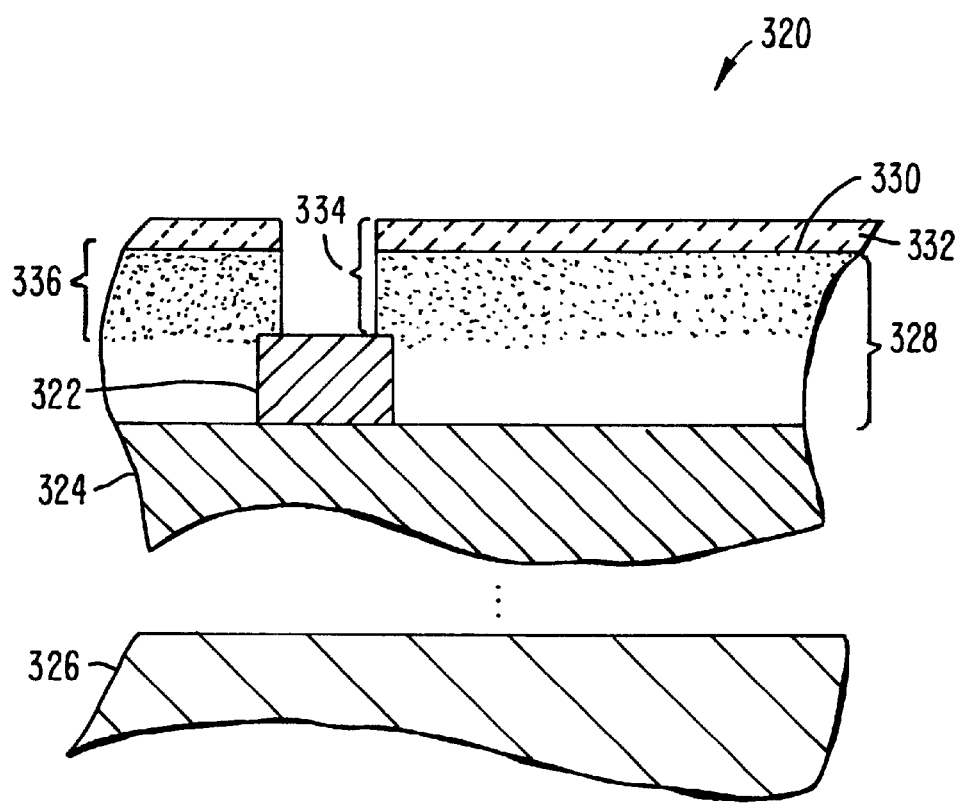
FIG. 3B is a simplified cross section of a portion of the part of the integrated circuit shown in FIG. 3A.

FIG. 3B is a simplified cross section of a portion of an electronic device 320 showing a nitrided FSG layer and related structure according to an embodiment of the present invention. A metal layer 322 has been formed and patterned on a dielectric layer 324, which is supported by a substrate 326 and may or may not have intervening layers or materials (not shown). The first dielectric layer could be a layer of silicon glass, doped silicon glass, a layer of nitride or other dielectric material, or a combination of layers and/or materials. An FSG layer 328 has been formed over the patterned metal layer 322 and the dielectric layer 324 (FIG. 2, step 202). Chemical-mechanical polishing (FIG. 2, step 204) has produced a relatively flat, smooth surface 330 of the FSG layer 328, over which an optional undoped silicon glass ("USG") layer 332 about 2,000 Å thick has been deposited. The silicon glass layer 332 is also relatively flat and smooth, as it generally conforms to the underlying surface, which is desirable when fabricating subsequent layers.

Prior to depositing the undoped silicon glass layer, the chemically-mechanically polished surface of the FSG layer was nitrided by exposing the surface of the FSG layer to a nitrogen-containing plasma for a time and at a temperature sufficient to transport nitrogen into the FSG layer to a selected depth (FIG. 2, step 206). In this case, the depth selected is approximately the via depth 334 through the FSG layer, which is typically between about 5,000–9,000 Å. The via can be formed using conventional lithography and etching techniques, and is typically subsequently filled, or plugged with a conductive material, such as titanium/ titanium nitride aluminum, tungsten, and/or copper, to electrically couple the patterned metal layer to a subsequent metal layer (not shown). The plug material can be the same or different from the subsequent metal layer.

The nitriding process forms a nitrided FSG region 336 in the FSG layer. Those skilled in the art will appreciate that the nitrogen concentration can vary throughout the nitrided region, generally ranging from about 0.40 at. % at the surface of the nitrided region and diminishing to about 0.01 at. % or less at the interface between the nitrided and unnitrided region (as-deposited FSG), and that the location of the interface is primarily a matter of defining the limit of the desired nitrogen concentration.

V. Nitriding Treatment Step Sequencing

The nitrogen treatment process to a chemically-mechanically polished surface of an FSG layer according to the present invention can be achieved using a variety of process conditions. This allows the user to select the process conditions most appropriate for the material (substrate) or device design. For example, it is generally desirable to achieve any process result in the shortest time when fabricating semiconductor devices because of the large capital investment in the fabrication facility and the competitive pricing of the products, both of which compel high throughput. Therefore, a higher process temperature and a shorter process time may be chosen in some circumstances. Those skilled in the art will understand that the final result is achieved according to several process variables, such as time, temperature, and plasma nitrogen concentration, among others. Those skilled in the art will also understand that times, power levels, and other parameters given below relate to a particular substrate processing system, and that the processing parameters may be modified to adapt other processing systems to perform the process described below or other similar processes.

Generally, however, when the present invention is used to add nitrogen to a chemically-mechanically polished FSG layer in which a 5,000–9,000 Å via is to be formed, the nitride step will subject the layer to a nitrogen plasma for between about 40 and 70 seconds. The wafer will be heated during this time to between about 380 and 400° C. Such processing conditions may be used to incorporate nitrogen into the FSG layer all the way down to the via depth. It is preferable that the amount of nitrogen incorporated into the film to the selected depth (e.g., via depth) be at least $1 \times 10^{19}$ atoms/cm$^3$ and even more preferable that it be between at least $5 \times 10^{19}$ atoms/cm$^3$ and $1 \times 10^{20}$ atoms/cm$^3$.

To further illustrate the nitriding step of the present invention, the following process is given as an example only. In this example the substrate to be nitrided is placed into an ULTIMA™ system chamber, which is described above in Section II, after having a chemically-mechanically polished FSG layer formed on the substrate surface. During the loading operation, the throttle valve is fully open while the turbo pump pumps down the chamber, and argon is flowed into the chamber at a flow rate of 126 sccm, with 16 sccm flowing through the top nozzle. After loading is complete, the proper pressure for striking the plasma is reached by closing the throttle valve and waiting no more than ten seconds for the chamber pressure to rise above 50 mTorr, after which time a source RF power of 1000 W is applied to the top coil for one second to strike a plasma in the chamber. Next, 1000 W of source power is applied to the side coil while the throttle valve is opened to a fixed position of 100 steps, which takes approximately one second. This establishes a stable plasma with sufficient source power before the nitrogen source is flowed into the chamber.

Nitrogen gas (N$_2$) is added to the plasma at an initial rate of 30 sccm for three seconds while the throttle valve is opened to a position of 400 steps. As will be shown below, minimal heating of the substrate occurs during these five seconds that the substrate is exposed to a plasma receiving source power at these levels. After the nitrogen has been flowing for three seconds, the argon flow is turned off and the nitrogen flow is increased to 80 sccm, while an RF bias power of 350 W is applied in addition to the 2,000 W of RF source power, and the throttle valve is fully opened for 50 seconds. More or less RF bias power may be applied, according to the desired temperature to be attained by the substrate.

During this nitriding process step, as in the above steps, the electronic chuck is off and no back-side helium coolant gas is flowing. The plasma heats the substrate to just below about 400° C. It is desirable to stay below the temperature at which the FSG layer was deposited, which in this case is between about 410–420° C., to avoid delamination at the FSG interface with proximate materials, and to avoid other undesirable changes in the FSG layer. An even lower temperature limit may be appropriate in some circumstances, such as if there are temperature-sensitive structures on the substrate that need to be kept at the lower temperature. Conversely, higher temperatures, and hence shorter process times, may be used if they do not result in unacceptable device yields or reliability, such as if the FSG film was deposited at a temperature higher than 420° C. Similarly, different times and temperatures may be used depending on the desired depth of the nitrided FSG.

In this example, the nitriding is done without the backside helium cooling in order to heat the substrate quickly and reduce throughput time. Therefore, the temperature of the substrate versus time has been characterized and verified using test wafers. In this instance, the substrate is an 8" silicon wafer with a bulk resistivity of 1.5 ohm-cm. The rate of heating of a silicon wafer depends on the bulk resistivity of the wafer. Generally, a wafer with a lower bulk resistivity (higher electrical conductivity) has greater thermal conductivity, and it takes longer to heat the surface region with a plasma.

Figure 4:
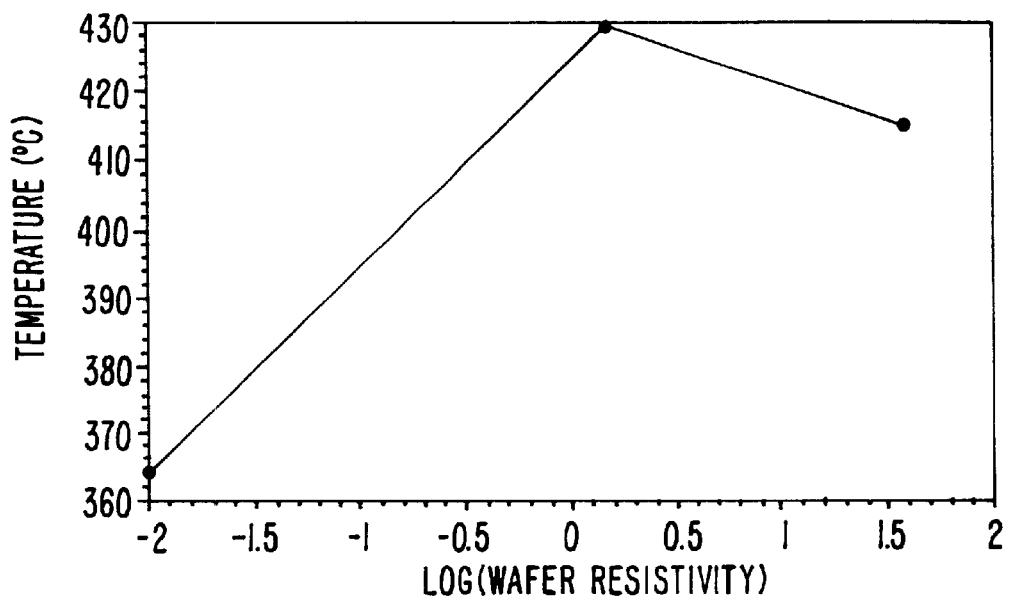
FIG. 4 is a graph of wafer temperature at the end of a nitrogen treatment step according to one embodiment of the present invention versus bulk resistivity of silicon wafers exposed to standard plasma conditions for approximately one minute.

FIG. 4 shows wafer temperature at the end of a nitrogen treatment step versus bulk resistivity of silicon wafers exposed to a nitrogen plasma under the same conditions and time. FIG. 4 shows that the wafer temperature goes up about 60° C. with a change in resistivity from about 0.01 ohm-cm to 1.00 ohm-cm.

Heatsinking the back side of the wafer, as by chucking the wafer to the wafer support, would conduct heat out of the wafer and further delay the heating process at a given power level. Flowing a coolant, such as helium gas, between the back side of the wafer and the wafer support would improve the heat conduction out of the wafer and slow the heating process; however, chucking the wafer and flowing coolant may be appropriate under some circumstances, such as when a lower process temperature is desired and/or the throughput of the process is not critical or when a standard nitriding process for a series of wafers with varying resistivities is desired, and/or when a temperature-controlled feedback system is used.

The above nitriding process results in a wafer surface temperature of about 390° C. and a chamber pressure of about 3 mTorr. The resulting nitrided FSG region has a nitrogen concentration of about 0.40 at. % near the surface of the FSG layer and extends about 8,000 Å into the FSG layer. It is believed that about 0.40 at. % is the solubility limit of nitrogen in this type of material at this temperature. Similar processes on similar wafers have produced nitrided depths of between about 5,000–9,000 Å. Those skilled in the art will appreciate that the solubility limit can be influenced by many variables, including the composition, structure, and temperature of the FSG layer and that the extent of nitrogen diffusion into the FSG layer is a function of at least the concentration of nitrogen near the surface of the FSG layer and the time-temperature product while the FSG layer is exposed to the nitrogen.

As previously discussed, it is highly desirable to select process conditions including temperature, pressure, gas flow rate and time, among other variables, so that nitrogen extends to at least the via depth. Nitriding suppresses the formation of HF in the via region and improves film stability to that depth. In other embodiments, it is preferable for the nitrogen to penetrate at least a fixed or percent distance farther than the via depth in order to ensure a higher nitrogen concentration at the via depth. The inventors have determined that the nitrogen does not adversely effect conductive features beneath the FSG layer in instances when penetration is beneath the via depth.

The nitrided FSG has a dielectric constant of about 3.5, which is comparable to the dielectric constant of the FSG. The nitriding process also increases the compressive stress of the FSG film by a factor of about 2. For example, the compressive strength increased from about $6.0 \times 10^8$ dynes/$cm^2$ in an FSG film before the nitriding process to about $1.2 \times 10^9$ dynes/$cm^2$ after the nitriding process. The increased compressive stress is useful in reducing cracking in patterned metal layers, which typically have tensile stress, that are surrounded or partially surrounded by the nitrided FSG. The increased compressive stress is especially desirable in the "higher" metal layers of a multi-metal-layer electronic device, especially with geometries less than about 0.25 microns.

After nitriding the chemically-mechanically polished FSG film, a cap layer, barrier layer, adhesion layer, or other layer may be applied on the nitrided FSG, if desired, or the substrate may be otherwise processed A cap layer is a relatively thin (e.g. 2,000 Å thick) layer of undoped silicon glass, for example.

VI. Test Results

Figure 5:
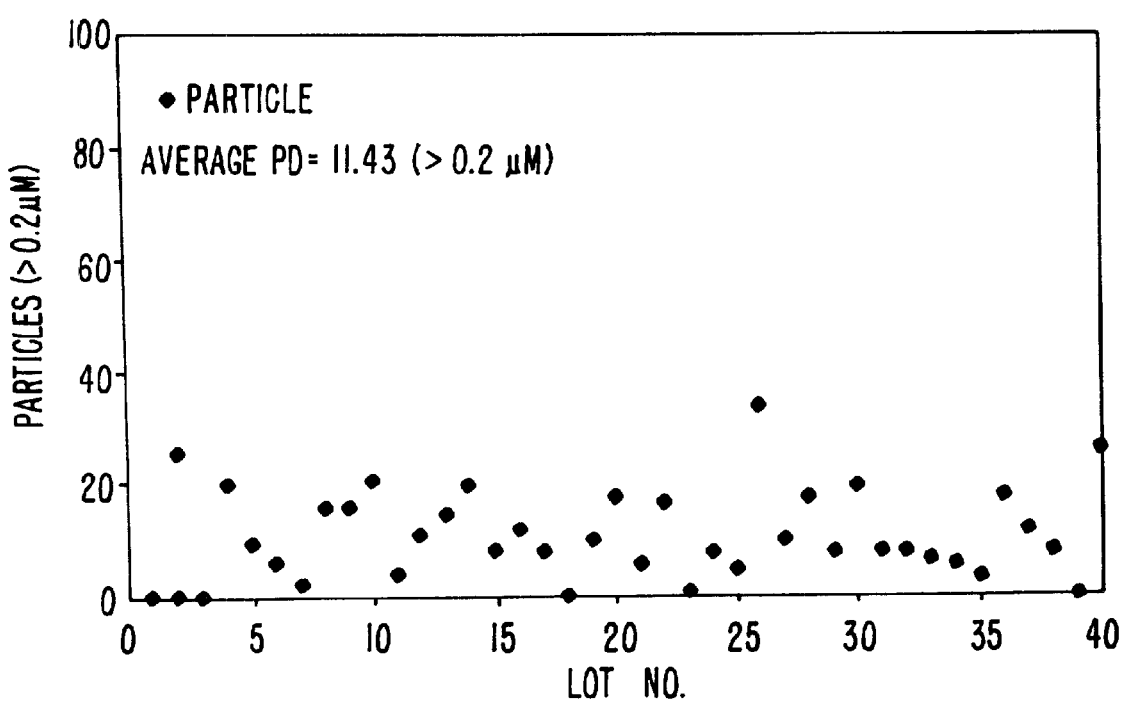
FIG. 5 is a chart showing the particle count for one thousand wafers fabricated according to one embodiment of the method of the present invention.

FIG. 5 is a chart showing the particle count for one thousand wafers fabricated according to an embodiment of the present invention in an ultima™ chamber HDP as described above in Section V. The average particle density is about 11 for particles greater than 0.2 microns. Alternative nitrogen plasma treatments were evaluated. In particular, a nitrogen plasma with no RF bias power, i.e. powered only by RF source power was evaluated. In a RF source-power-only (no RF bias power) process, 2,500 W of power was supplied to the top coil, while 3,500 W of power was supplied to the side coil. In a chamber seasoned with a layer of silicon oxide, the number of particles over 0.2 microns added by the RF source-power-only nitriding process ranged from 25 to over 7,000, with the average number of particles added being about 3,500. Through experimentation it was determined that the number of particles added during a source-power-only nitriding process is not extremely sensitive to a number of parameters, including thickness of the seasoning layer, composition of the seasoning layer (e.g., FSG vs. USG), or the wafer number processed after seasoning the chamber. However, it was determined that the number of added particles is sensitive to the RF source power applied to the plasma.

Figure 6A:
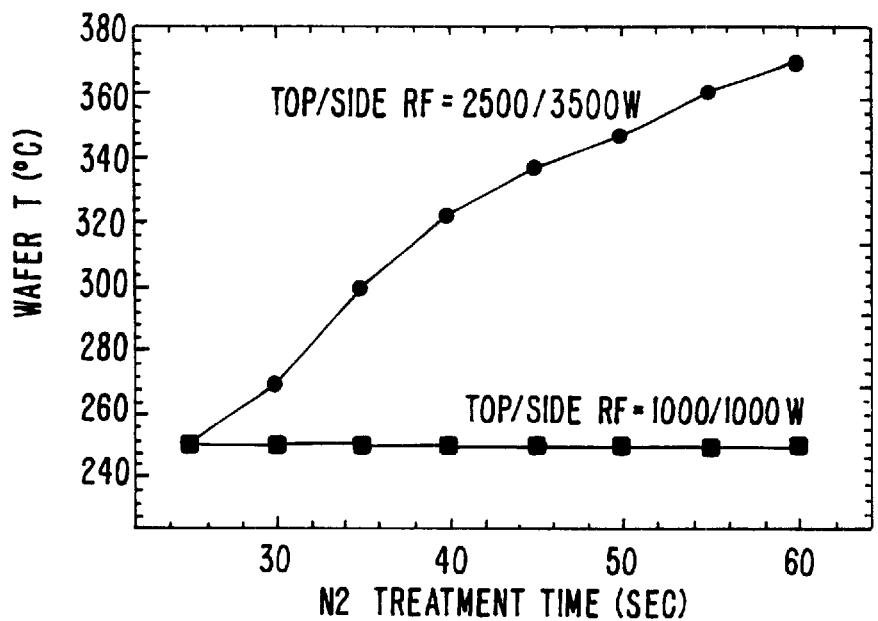
FIG. 6A is a graph showing wafer temperature versus time for wafers in the presence of a plasma powered by a relatively high source RF power.
Figure 6B:
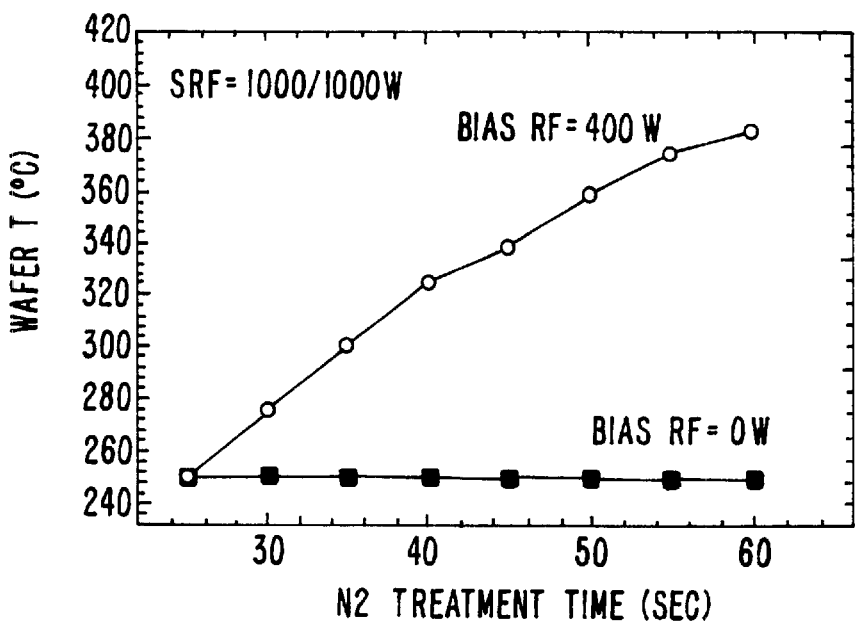
FIG. 6B is a graph showing wafer temperature versus time for wafers in the presence of a plasma powered by a relatively high source RF power and a bias RF power.

FIG. 6A is a graph showing wafer temperature versus time for a substrate exposed to a nitrogen-containing plasma powered by an RF source power of 2,500 W supplied to the top coil and 3,500 W supplied to the side coil. FIG. 6B is a graph showing wafer temperature versus time for a substrate under similar conditions exposed to a nitrogen-containing plasma powered by an RF source power of 1,000 W supplied to the top coil, 1,000 W supplied to the side coil, and 400 W of RF bias power. The heating curves are similar, and nitriding of the chemically-mechanically polished FSG film was achieved with both processes. Hence, it was determined that using RF bias power in conjunction with RF source power to heat the wafer was an efficient way to heat the wafer and did not produce excessive particulate contamination.

Heating without RF bias power is a simpler process; therefore a source-power-only process is desirable, if possible. However, it is believed that plasmas powered by a source power high enough to heat the substrate to a temperature of about 400° C. tend to sputter the seasoning coating (a layer of silicon oxide, in this case, applied to line the interior of the processing chamber to minimize contamination of the substrate). As an alternative to using RF bias power to heat the substrate, other heating sources, such as a heater in the wafer support pedestal, may be used to attain essentially the same temperature, or an intermediate source power may be used, if a lower temperature (longer time) and lower nitrogen concentration are acceptable. Similarly, an intermediate RF power (between 100–400 W) may be used, with the appropriate adjustment in RF source power to achieve the selected substrate temperature.

Figure 7A:
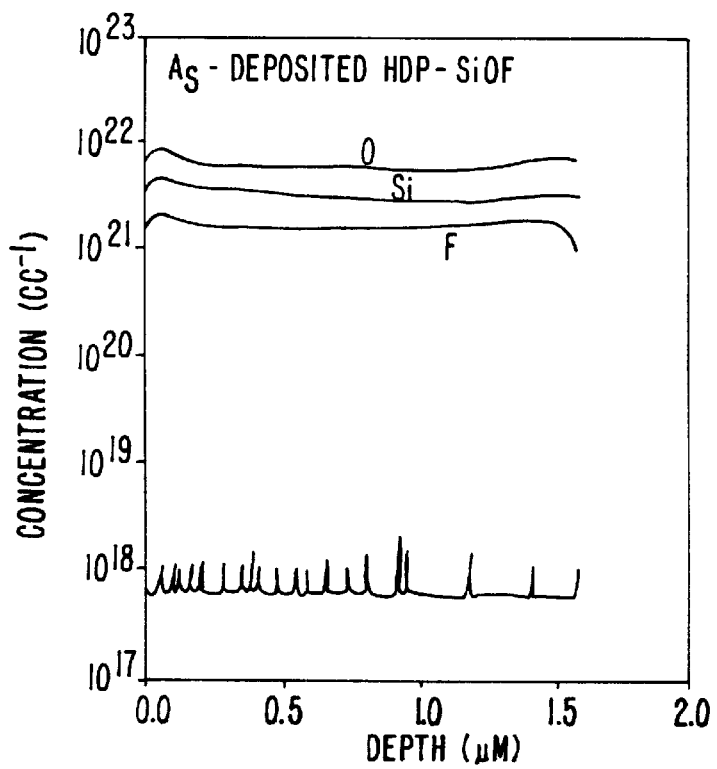
FIG. 7A is a graph showing the approximate concentration of selected atomic elements versus depth from the surface of an as-deposited FSG film after treatment in a nitrogen plasma at a relatively low selected RF source power without RF bias power.
Figure 7B:
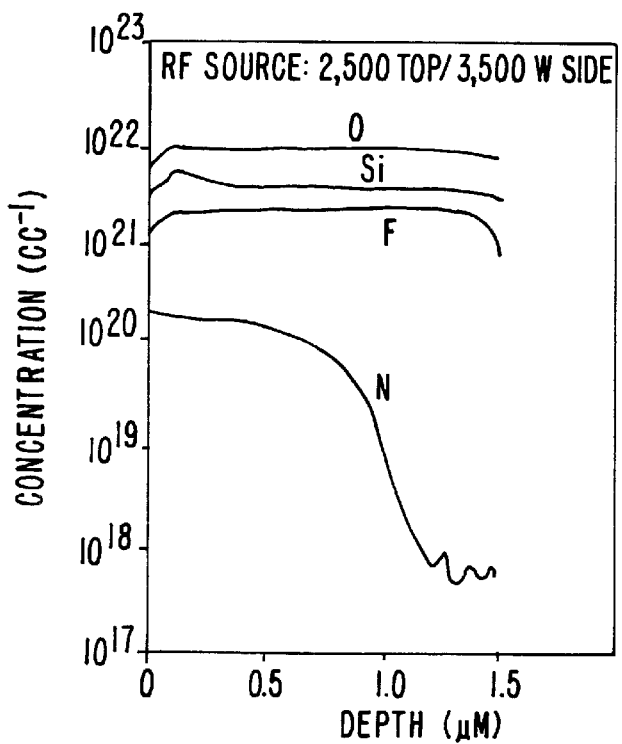
FIG. 7B is a graph showing the concentration of nitrogen versus depth from the surface of an FSG film after treatment in a nitrogen plasma for one minute at a relatively high RF source power without RF bias power.
Figure 7C:
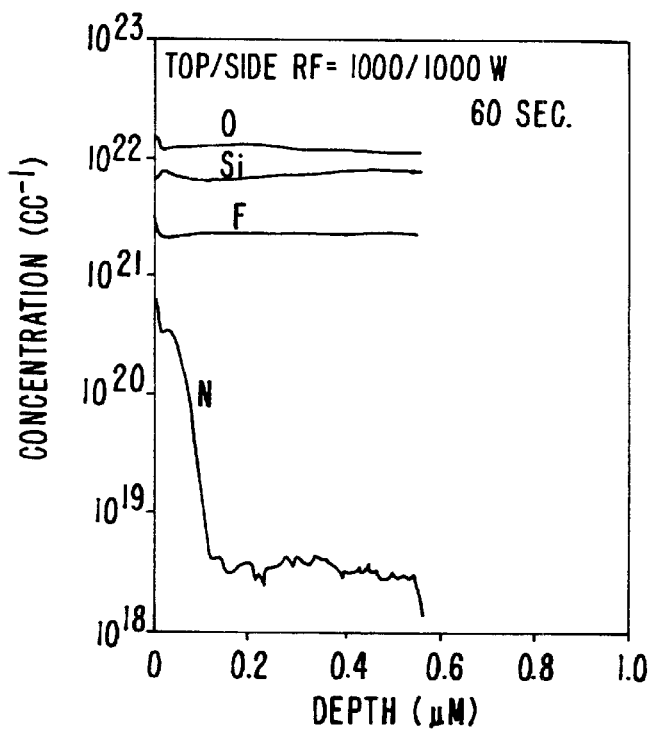
FIG. 7C is a graph showing the concentration of nitrogen versus depth from the surface of an FSG film after treatment in a nitrogen plasma for one minute at a relatively low RF source power and no RF bias power applied.
Figure 7D:
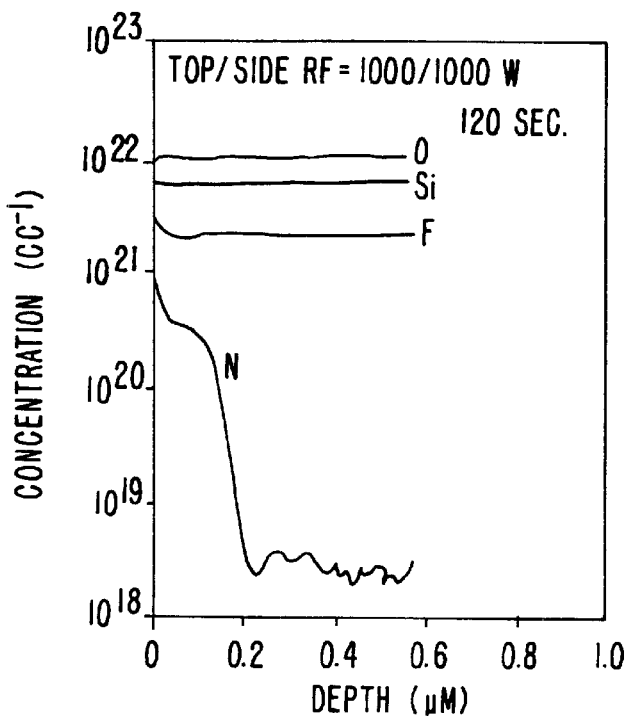
FIG. 7D is a graph showing the concentration of nitrogen versus depth from the surface of an FSG film after treatment in a nitrogen plasma for two minutes at a relatively low RF source power and no RF bias power applied.
Figure 7E:
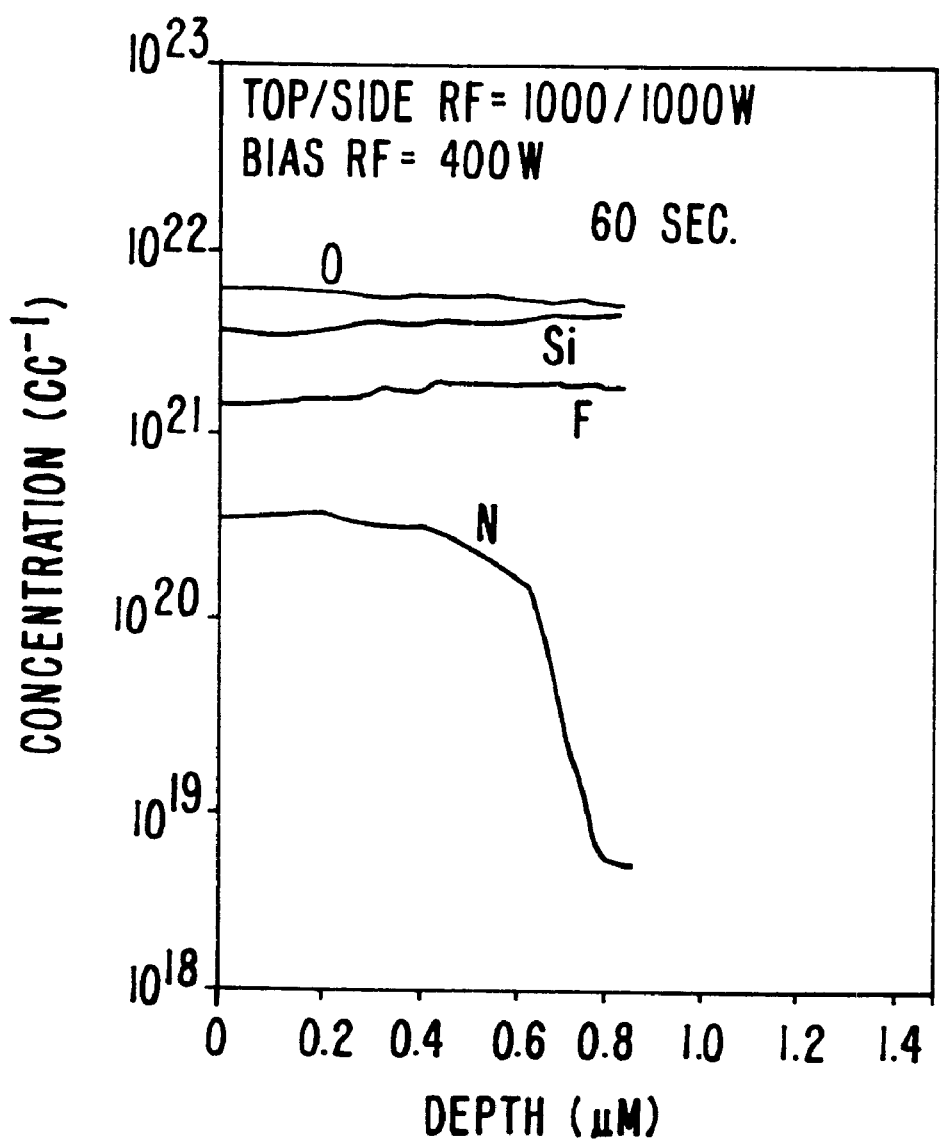
FIG. 7E is a graph showing the concentration of nitrogen versus depth from the surface of an FSG film after treatment in a nitrogen plasma for one minute at a relatively low RF source power with RF bias power applied.

FIG. 7A is a SIMS spectrum of an as-deposited FSG layer deposited in an Ultima HDP chamber. The graphs shows that background concentration levels of nitrogen in an FSG layer can be around $1\times10^{18}$ atoms/cm$^3$. In comparison, FIG. 7B is a SIMS spectrum of an FSG layer after nitriding for 60 seconds in a nitrogen-based plasma with an RF source power of 2,500 W to the top coil and 3,500 W to the side coil. This data shows that the FSG has incorporated nitrogen to a depth of about 0.9 microns, before the nitrogen concentration rapidly declines to background levels. FIG. 7C is a SIMS spectrum of an FSG layer after nitriding for 60 seconds in a nitrogen-based plasma with an RF source power of 1,000 W applied to the top coil and 1,000 W applied to the side coil, and with no RF bias power. Note that the horizontal scale is different and that nitrogen is incorporated into the FSG for a depth of only about 0.1 microns from the surface. FIG. 7D is a SIMS spectrum of an FSG layer after nitriding for 120 seconds in a nitrogen-based plasma with an RF source power of 1,000 W applied to the top coil, 1,000 W applied to the side coil, and with no RF bias power. At this exposure time the FSG incorporated nitrogen to a depth of about 0.15 microns from the surface. FIG. 7E is a SIMS spectrum of an FSG layer after nitriding for 60 seconds in a nitrogen-based plasma with an RF source power of 1,000 W applied to the top coil, 1,000 W applied to the side coil, and 400 W of RF bias power. Comparing FIG. 7E with FIG. 7B shows that bias RF power is an efficient way to increase the wafer temperature and diffusion of nitrogen into the FSG layer.

The method of the present invention is not intended to be limited by the specific parameters set forth above. Those of ordinary skill in the art will realize that different processing conditions and different reactant sources can be used without departing from the spirit of the invention. For example, a plasma could be generated from $N_2O$, ammonia, or another nitrogen source, or other elements, such as helium or hydrogen, could be added to the plasma in addition to the nitrogen source. Those of ordinary skill in the art will also realize that some such additions might alter the heating or sputtering characteristics of the plasma according to acceptable processing parameters. Also, while the application primarily discussed nitriding FSG layers after CMP processing, it can also be used to nitride other halogen-doped silicon glass layers post-CMP.

Additionally, although an embodiment described above uses an Ultima HDP-CVD system, other plasma systems, such as a parallel-plate plasma system, ECR plasma system, or even a remote plasma system might be used to provide nitrogen species to the halogenated silicon glass surface. Similarly, other heating methods might be used to heat the wafer to the desired temperature, such as heating the wafers with infrared lamps or on a resistively heated pedestal. Heating methods might also include an active temperature control feature. Other equivalent or alternative methods of nitriding a halogenated chemically-mechanically polished surface according to the present invention will be apparent to those skilled in the art, such as implanting nitrogen into the polished surface. These equivalents and alternatives are intended to be included within the scope of the present invention. Other variations will be apparent to persons of skill in the art. Accordingly, it is not intended to limit the invention except as provided in the appended claims.

What is claimed is:

1. A method for forming a dielectric layer on a substrate having a plurality of conductive lines formed thereon, the method comprising:
   (a) depositing a halogen-doped silicon glass layer on the substrate and over said conductive lines;
   (b) polishing the halogen-doped silicon glass layer to form a polished surface; and
   (c) nitriding the halogen-doped silicon glass layer so that a concentration of nitrogen in said halogen-doped silicon glass layer is greater than $1\times10^{18}$ atoms/cm$^3$ from an upper surface of said halogen-doped silicon glass layer to an upper surface of said plurality of conductive lines.

2. The method of claim 1 wherein the halogen-doped silicon glass layer comprises a fluorine-doped silicon glass layer.

3. The method of claim 1 wherein the halogen-doped silicon glass layer is polished using a chemical-mechanical polishing technique.

4. The method of claim 1 wherein the nitriding includes incorporating a nitrogen concentration of at least $1\times10^{20}$ atoms/cm$^3$ at least 2000 Å into the halogen-doped silicon glass.

5. The method of claim 1 wherein said halogen-doped silicon glass layer is deposited as an intermetal dielectric layer.

6. The method of claim 5 further comprising, after the nitriding said halogen-doped silicon glass layer step, patterning and etching said halogen-doped silicon glass layer to form a via connection to an underlying feature.

7. The method of claim 6 wherein said via has a depth and said nitriding includes incorporating a nitrogen concentration of at least $1\times10^{20}$ atoms/cm$^3$ to at least the depth of said via.

8. The method of claim 2 wherein at least an initial portion of the fluorine-doped silicon glass layer is deposited using only source RF power in a high-density plasma chemical vapor deposition chamber having an RF source electrode and an RF bias electrode.

9. The method of claim 1 wherein the nitriding includes heating the substrate by exposing it to a nitrogen-containing plasma.

10. The method of claim 9 wherein said nitrogen-containing plasma is formed in a high-density plasma processing chamber from only source RF power.

11. The method of claim 9 wherein the nitrogen-containing plasma is formed in a high-density plasma processing chamber from both source RF power and bias RF power.

12. The method of claim 9 wherein the nitrogen-containing plasma is formed from nitrogen gas.

13. A method for forming a dielectric layer on a substrate having a plurality of conductive lines formed thereon, the method comprising:
   (a) depositing a fluorine-doped silicon glass ("FSG") layer on the substrate and over said conductive lines;
   (b) polishing the FSG layer using a chemical-mechanical polishing technique to form a polished surface; and
   (c) nitriding the FSG layer to incorporate a concentration of at least about $5\times10^{19}$ atoms/cm$^3$ of nitrogen into the FSG layer from an upper surface of said FSG layer to an upper surface of said plurality of conductive lines by exposing the polished surface to a plasma formed from at least nitrogen gas.

14. The method of claim 13 wherein said plasma is formed from a gas consisting essentially of molecular nitrogen.

15. The method of claim 9 wherein said plasma is formed from a gas consisting essentially of molecular nitrogen.

16. A method for increasing the compressive stress in a layer of fluorine-doped silicon glass (FSG) on a substrate having a plurality of conductive lines formed thereon, the method comprising:
   (a) depositing an FSG film on the substrate;
   (b) polishing the FSG film; and
   (c) nitriding the FSG film by exposing the FSG film to a plasma formed from a nitrogen source gas for a period of time and at a temperature sufficient to incorporate nitrogen into the FSG film at a concentration of at least about $10^{20}$ atoms/cm$^3$ from an upper surface of said FSG film to an upper surface of said plurality of conductive lines.

17. The method of claim 16 wherein the FSG film has an initial compressive stress prior to the step (c) of nitriding and a subsequent compressive stress after the step (c) of nitriding, the initial compressive stress being about one-half of the subsequent compressive stress.

18. The method of claim 16 wherein the substrate includes a patterned metal layer disposed between a semiconductor wafer and the FSG film, the FSG film having been deposited over, and being proximate to, the patterned metal layer.

* * * * *